United States Patent [19]

Elabd et al.

[11] Patent Number: 4,604,652
[45] Date of Patent: Aug. 5, 1986

[54] CCD IMAGERS WITH PIXELS AT LEAST THIRTY MICRONS LONG IN THE DIRECTION OF CHARGE TRANSFER

[75] Inventors: Hammam Elabd, Mercer County; Walter F. Kosonocky, Somerset County, both of N.J.; Donald F. Battson, Lancaster, Pa.

[73] Assignee: RCA Corporation, Princeton, N.J.

[21] Appl. No.: 685,725

[22] Filed: Dec. 24, 1984

[51] Int. Cl.⁴ .............................................. H04N 3/14
[52] U.S. Cl. ................................ 358/213; 352/24 LR
[58] Field of Search ....................... 358/213, 212, 211; 357/24 LR

[56] References Cited

U.S. PATENT DOCUMENTS 4,507,684 3/1985 Battson .................................. 358/213
4,513,313 4/1985 Kinoshita ............................. 358/213
4,527,199 7/1985 Kinoshita ............................. 358/213

Primary Examiner—Gene Z. Rubinson
Assistant Examiner—L. C. Schroeder
Attorney, Agent, or Firm—Joseph S. Tripoli; George E. Haas; Allen LeRoy Limberg

[57] ABSTRACT

CCD imagers with pixels at least thirty microns long in the direction of charge transfer have their image registers forward clocked with at least five phases. The length of gate electrodes under which barrier are induced during image integration does not exceed the five to ten microns associated with acceptably low grain. Image integration takes place without applying voltages for inducing potential energy barrier to adjacent gate electrodes in the image register. These measures permit video signals with acceptably low grain to be obtained from these large-pixel images, solving a longstanding problem in the art.

10 Claims, 4 Drawing Figures

CCD IMAGERS WITH PIXELS AT LEAST THIRTY MICRONS LONG IN THE DIRECTION OF CHARGE TRANSFER

The present invention relates to solid state imagers with pixel sizes at least thirty microns long on a side and, more particularly, to CCD imagers in which the photosensing is done in the CCD charge transfer channels themselves of the image register portions of the CCD imagers.

BACKGROUND OF THE INVENTION

The problem of obtaining satisfactorily high yields of usable monolithic solid-state imagers becomes increasingly difficult with increase of the area of the monolithic semiconductor die on which the imager reposes. This is especially so in the case of back-illuminated CCD imagers. The monolithic semiconductor dies on which they are constructed are thinned from five hundred microns or so to ten microns or so, making them perhaps the most difficult semiconductor devices to manufacture. It is desirable to keep low the number of phases of clocking signal applied to the gate electrodes of CCD registers in a CCD imager in order to transfer charge. This not only simplifies clocking signal generation, but makes it easier to bus the various clocking signal phases across the surface of the imager. While clocking with two phases or with uni-phase variants of two-phase clocking has been used in CCD imager shift register operations, this requires differential doping of the surface of the semiconductor die to which one would prefer not to have resort, and these types of operation are more likely to fail owing to interelectrode shorts. Three-phase clocking of the registers in CCD imagers has accordingly come to be preferred. This is so even though four-phase clocking of the image and field storage registers of a field transfer type of CCD imager is known to provide for more accurate line interlace on alternate fields where such interlace is used. Such four-phase clocking is described as an alternative by W. F. Kosonocky in U.S. Pat. No. 3,932,775 issued Jan. 13, 1976, and entitled "INTERLACED READOUT OF CHARGE STORED IN A CHARGE COUPLED IMAGE SENSING ARRAY."

CCD area-array imagers commercially available have tended to be small with sensor arrays that have an eight millimeter diagonal being the present standard. But there has been a desire to increase the size of the sensor arrays to have an eleven millimeter diagonal, so that the optical systems developed for vidicons and commercially available at advantageous prices can be employed with solid state imagers. Redesigning standard field transfer CCD imagers using three-phase clocking to have a pixel size more than twenty microns on a side in their image registers, in order to provide eleven millimeter diagonal dimension for those image registers, results in an unacceptably noisy video signal. A person viewing a television picture based on the CCD imager output video signal can tolerate appreciable amounts of the random noise called Johnson noise or dark current noise, which arises from thermodynamic processes in the imager. As long as patterned noise accompanying the video signal is smaller than the random noise, the random noise will mask the presence of the patterned noise in the television picture insofar as person viewing it is concerned. Patterned noise that is not smaller than the random noise is (at least to the point where random noise is so small as to be indiscernible) readily discernible to the person viewing the television picture and is categorized as being unacceptable in level by CCD imager designers. CCD imagers using three-phase clocking and having a pixel size more than twenty microns long in the direction of charge transfer through the image register generate a type of patterned noise that exhibits itself as "grain" in a television display based on the video signal, which grain resembles that encountered in silver halide photography prints owing to the random crystalline structure in the silver halide films. This grain has been a difficult obstacle to solid-state imager designers seeking to use CCD imagers of types which perform photoconversion in the image register CCD's themselves, particularly imagers of those types having large-area image registers. To obtain large-area sensor arrays, then, solid-state imager designers have tended to favor MOS (metal-oxide-semiconductor) imagers or interline transfer type CCD imagers, where photoconversion is not done in the CCD portions of the imager.

In the U.S. Pat. No. 4,507,684, issued Mar. 26, 1985 by D. F. Battson, entitled "REDUCING GRAIN IN MULTI-PHASE-CLOCKED CCD IMAGERS", and assigned to RCA Corporation, it is pointed out that grain in field transfer type CCD imagers is attributable to a certain type of partitioning noise. This partitioning noise affects the electrons generated by photoconversion in regions under the image register gate electrodes held low in potential in a multi-phase image register. With increase in the lengths of the barriers between potential wells, electrons generated in the regions between potential wells are less likely to be influenced by fringing fields from the potential wells induced under gate electrodes held high in potential. Consequently, these electrons are more likely to be affected by local electric field perturbations and so depart from ending up, on average, in the potential well closest to their generation site. This departure is perceived as grain structure in the image output. Grain increases rapidly as the lengths of potential barriers induced under certain of the gate electrodes becomes longer; this accords with the electrostatic force between an electron and a potential well being inversely related to the square of the distance between them. In buried-channel CCD imagers D. F. Battson experimented with, grain increased rapidly as the length of potential barriers under gate electrodes held low was made longer than five microns.

The Battson teaching has been followed to keep pixel size no more than twenty microns or so in direction of charge transfer in the three-phase-clock field transfer type of CCD imager. The number of pixels in the charge transfer channels of the image register are determined by the number of active (or picture) "scan" lines in each television field, numbering 240 or so for standard broadcast television and television signals according to related standards. This has helped to maintain as standard the 8 mm diagonal image register now commonly used in commercially available CCD area imagers.

In certain applications it is unacceptable, or at least undesirable, to reduce pixel size in the CCD imager. In certain earth satellite cameras, for example, the CCD imager is preceded by a very-narrow-passband optical filter which reduces the spectrum of energy reaching the imager. To obtain reasonably high sensitivity, pixel sizes fifty microns square or so must be used.

The present inventors advocate a different approach to following the Battson teaching, which approach does not require reducing pixel size in order to keep grain under control. In fact pixel length can be increased well above thirty microns when increasing pixel size to get better sensitivity. Sensitivity is improved because the photoconversion response, being spatially unrelated, increases linearly with pixel area while dark current noise, not being spatially correlated, increases as the square root of pixel area. The inventors advocate using a number n of clocking phases more than four in CCD imagers having pixel dimensions longer than thirty microns in the direction of charge transfer. Where the gate electrodes receptive of one cycle of these n-phases of clocking signal are of substantially equal length, n should be at least equal to the pixel length in the direction of charge transfer divided by the maximum gate electrode length (e.g., five to ten microns) associated with acceptably low grain. With the number n of clock phases being larger, the proportion of the charge carriers subject to partitioning by a potential energy barrier can be reduced to 1/n. So gate electrode length can be increased somewhat from the maximum length for three phases associated with acceptably low grain. During image integration, no two adjacent gate electrodes are held equally low in potential at the same time, again to avoid the effect of excessive potential barrier length. These steps preserve the fringing field effects needed to avoid grain generation.

In addition to keeping grain acceptably low, the n>4-phase clocking of the image register during field transfer intervals provides a larger charge handling capability for given pixel size and potential energy well depth than clocking in fewer phases does. This, as well as the improved sensitivity afforded by larger pixel size, facilitates larger dynamic range of the video signals from the field transfer CCD imager. At times in a three-phase-clocked register two of the three gate electrodes in each pixel must be simultaneously low, so charge can be held in a well no longer than one-third pixel length. In a clocked register clocked in n at least five phases, at times, two of the n gate electrodes in each pixel must be simultaneously low, so charge cannot be held in a well longer than (n-2)/n pixel length. This well can be three-fifths pixel length for n=5, two-thirds pixel length for n=6 and three-quarters pixel length for n=8, by way of examples. And, of course, n can be even to facilitate perfect line interlace when one interlaces the scan lines in alternate fields.

Transfer efficiency through a CCD imager with large area pixels can be improved by improving the number of clocking signal phases per pixel. The most important figure of merit for a charge-transfer device is commonly regarded as being the charge-transfer efficiency, denoted by $\eta$, which is the fraction of the original charge packet that is transferred from one storage site to the next. The fraction that is not transferred is denoted by $\epsilon$, the charge-transfer inefficiency, or charge-transfer loss. Since the potential well used to store and transfer minority carriers also serves to repel majority carriers, recombination is negligible. Thus, minority carriers are lost from the original charge packet only by being left behind (i.e., charge is either transferred or it is not). Thus, $$\eta + \epsilon = 1.$$

The effect of imperfect transfer efficiency is to erode the amplitude of the signal packet, so that after n transfers, the ratio of the signal level $A_n$ to the original level $A_o$ is given by $$A_n/A_o = \eta^n = (1-\epsilon)^n.$$

So $A_n/A_o$ approximates $\exp(-\epsilon n)$ for small values of $\epsilon$. This seems to indicate that the number of clock phases per pixel should be decreased, rather than increased per the invention, but there is more to be considered.

Two different effects prevent the attainment of perfect efficiency—the time required to transfer the free charge in the packet from one site to the next and trapping effects. Several driving mechanisms cause the free charge to transfer, including charge repulsion, thermal diffusion, and drift in the externally applied fields (fringing fields). Charge-repulsion effects are unimportant after most (about 99%) of the charge has transferred, so that the limitations on device speed are essentially determined by either thermal diffusion or fringing field drift. Both of these mechanisms cause an exponential decay of charge under the transferring electrode. The magnitude of the time constants for this decay determines the efficiency that can be achieved at any particular clock frequency, since the clock frequency determines the time available for transfer.

The time constant for thermal diffusion can be estimated by simple physical arguments which indicate that this time is $l^2/2.5D$.

Charge transfer is also enhanced by carrier drift in the field induced by the externally applied gate voltages. The externally applied field is principally directed perpendicular to the motion of charge, but there is a component of field along the direction of motion. The calculation of these fringing fields involves a rather complex two-dimensional electrostatic problem generally requiring a numerical solution. The transit time (or decay time constant) for fringing-field drift is then given by $$T = \frac{l}{\mu E_{min}} = \frac{l^3}{3.2\mu V X_{ox}}$$

where l is the gate length in the transfer direction, $\mu$ is the carrier mobility, V is the gate voltage, and $X_{ox}$ is the thickness of the gate oxide. In addition, because the fringing-field time constant depends upon $l^3$s, the increase in speed over that possible with thermal diffusion increases as gate length is decreased. Also, fringing-field drift is relatively more important in buried-channel devices, since the channel is a greater distance from the gates, effectively increasing the $X_{ox}/l$ factor.

Trapping also occurs in buried-channel devices in mono-energetic bulk states. Since the number of states that participate in trapping is low, the effect is small. The number of trapping states per unit area is equal to the volume density times the distance over which signal charge resides in the channel. This distance is on the order of 1 $\mu$m, so that $10^{12}$ states/cm$^3$ would result in only about $10^8$ states/cm$^2$ states effective in surface channel devices.

In designing the gate structure for a large pixel, then, it is desirable to reduce l to a small value and at the same time maximize the charge storage area by having as many as possible of the gates crossing the pixel biased for accumulation during the charge integration period. One must balance the improvement in transfer efficiency of this approach for given forward clocking frequency by the accumulatative effect of increasing the number of transfers in moving the charge from one pixel to another, to determine when increase in the number of gate electrodes per pixel is no longer advantageous.

While one can design the n>4-phase clocked image register so that gate electrodes under which barrier potential is erected are short enough that there is sufficient fringing field to avoid partitioning noise as will generate unacceptably large "grain", and at the same time make the other gate electrodes longer, there is a reason for making the gate electrodes all of substantially the same length. Making the gate electrodes of different length reduces the speed at which the underlying charge channels can be clocked without adversely affecting transfer efficiency. It is desirable to transfer charge packets out of the image register as quickly as possible to keep transfer smear acceptably low despite the presence of bright objects in the radiant image received by the CCD imager.

SUMMARY OF THE INVENTION

The present invention is embodied in certain CCD imagers having image registers comprising parallelled charge transfer channels, in which photoconversion takes place at certain intervals responsive to a radiant energy image, and from which accumulated charge packets representative of image elements are transferred. Transfer is made responsive to a clocking signal having n successive-in-time phases, n being an integer greater than four. Each of the image elements has a length L in the direction of charge transfer of at least thirty microns and is crossed by n successive gate electrodes consecutively receptive of successive phases of the n-phase clocking signal. The gate electrodes under which potential barriers are induced during image integration have lengths not longer than the length associated with acceptably low grain (e.g., five to ten microns).

DETAILED DESCRIPTION

Figure 1:
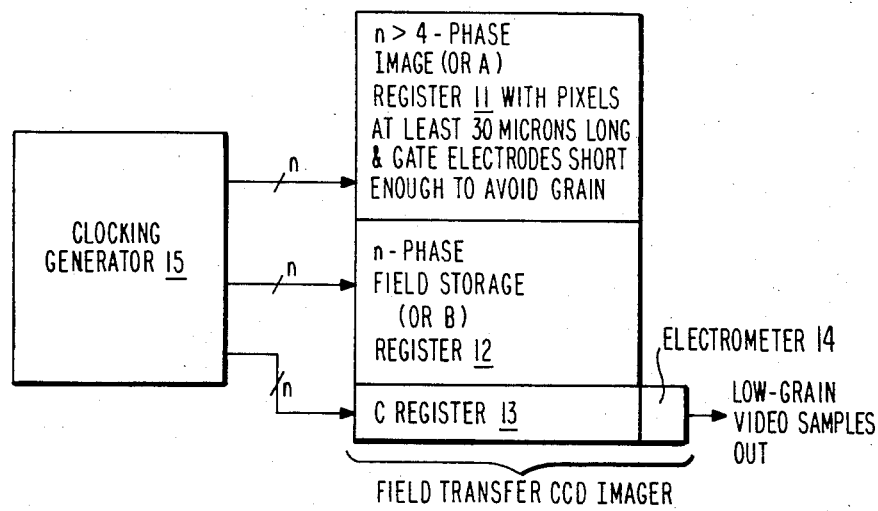
FIG. 1 is a block diagram of a television camera incorporating a field transfer type of CCD imager embodying the invention.

In FIG. 1 a field transfer CCD imager 10 comprises an image (or A) register 11 illuminated by a radiant energy image (by means not explicitly shown) a field storage (or B) register 12 shielded from illumination, an output line (or C) register 13 and an electrode output stage 14. A register 11 has gate electrodes no longer than the length l which provides sufficient fringing field to suppress grain satisfactorily. These gate electrodes (not explicitly shown) are arranged in cycles of n consecutive gate electrodes respectively receptive during field transfer intervals of successive phases of an n-phase forward clocking signal supplied from a clocking generator 13. Each cycle of n gate electrodes takes up a length L in A register 11 that defines the image element (or pixel) length in the direction of charge transfer to B register 12. This length L is at least thirty microns; and n is greater than four.

B register 12 receives from clocking generator 15 an n-phase forward clocking signal during field transfer intervals, when the charge packets representative of image element brightness that are accumulated in A register 11 during foregoing image integration intervals are transferred from A register 11 to B register 12. This transfer is made by forward clocking registers 11 and 12 simultaneously in synchronism with each other and at relatively high rate. The field transfer intervals are during the field retrace portions of the video signal samples of which are supplied as output signal from electrometer 14.

During the ensuing field trace portion of the video signal, image integration resumes in A register 11 which again receives a static n-phase clocking signal. B register 12 is forward clocked through one cycle of n-phase forward clocking each line retrace interval, to advance the charge packets stored therein ahead one line, with the line of charge packets transferred out of B register 12 being, parallelly loaded into respective ones of the charge transfer stages in C register 13. C register 13 is then forward clocked at pixel scan rate during the ensuing line trace interval while B register 12 receives static clocking signal from generator 15. C register 13 responds to this forward clocking at pixel scan rate, shown as being applied in n phases from generator 15, to operate as a shift register supplying charge packets descriptive of pixels serially in time to electrometer output stage 14 to generate video signal sample output.

Figure 2:
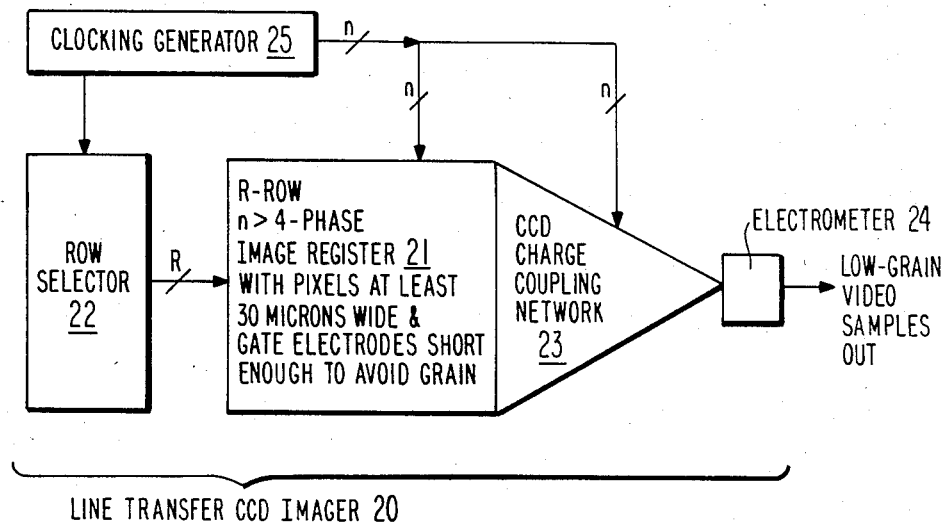
FIG. 2 is a block diagram of a television camera incorporating a line transfer type of CCD imager embodying the invention.

FIG. 2 shows a line transfer type of CCD imager 20 (e.g., similar to that described by P. K. Weimer in U.S. patent application Ser. No. 650,615 filed Sept. 14, 1984, entitled "TDM-INPUT ELECTROMETER, AS IN A LINE TRANSFER CCD IMAGER, USING A CHARGE FUNNEL", and assigned to RCA Corporation). Imager 20 has an image register 21 having a number R (typically a few hundred) of "rows"—i.e., parallelled charge transfer channels in which charge packets representative of pixel brightness are accumulated. During each line time in the video signal forward from imager 20 output samples, one transfer channel or a pair of adjacent charge transfer channels in image register 21 are selected by a row selector 22 for reading out at pixel scan rate. Read-out is done by forward clocking the selected charge transfer channel(s) with n-phase clocking signal supplied from clocking generator 25, which also times row selector 22. The read-out line of charge packets descriptive of the brightness of image elements is passed through charge coupling network 23, which usually includes at least one CCD charge transfer channel forward clocked with n-phase clocking pixel signal, supplying the charge packets serially in time to the input of an electrometer output stage 24. Electrometer 24 responds to the serially supplied charge packets with video output signal samples, usually in voltage form.

The width W of pixels is greater than thirty microns in the direction of charge transfer in image register 25. The length of gate electrodes in this direction is constrained to a length l that will keep grain satisfactory low. In accordance with the invention tne number of phases n in which image register 21 and CCD charge transfer channels in CCD coupling network 23 forward clocked is made larger than four and larger than W/l.

Figure 3A:
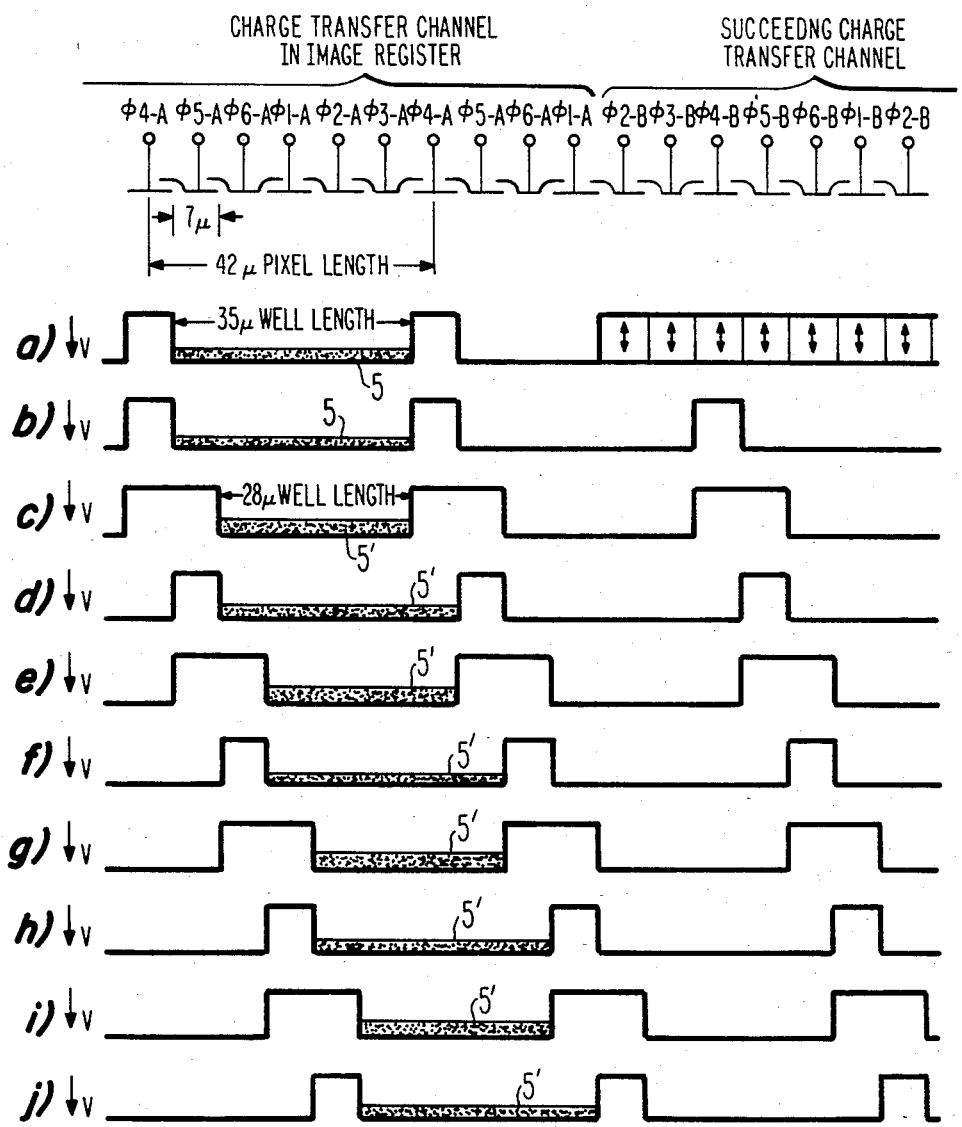
FIGS. 3A and 3B illustrate typical in-channel charge profiles encountered in a charge transfer channel of the image register and ensuing CCD device of the FIG. 1 or FIG. 2 CCD imager.
Figure 3B:
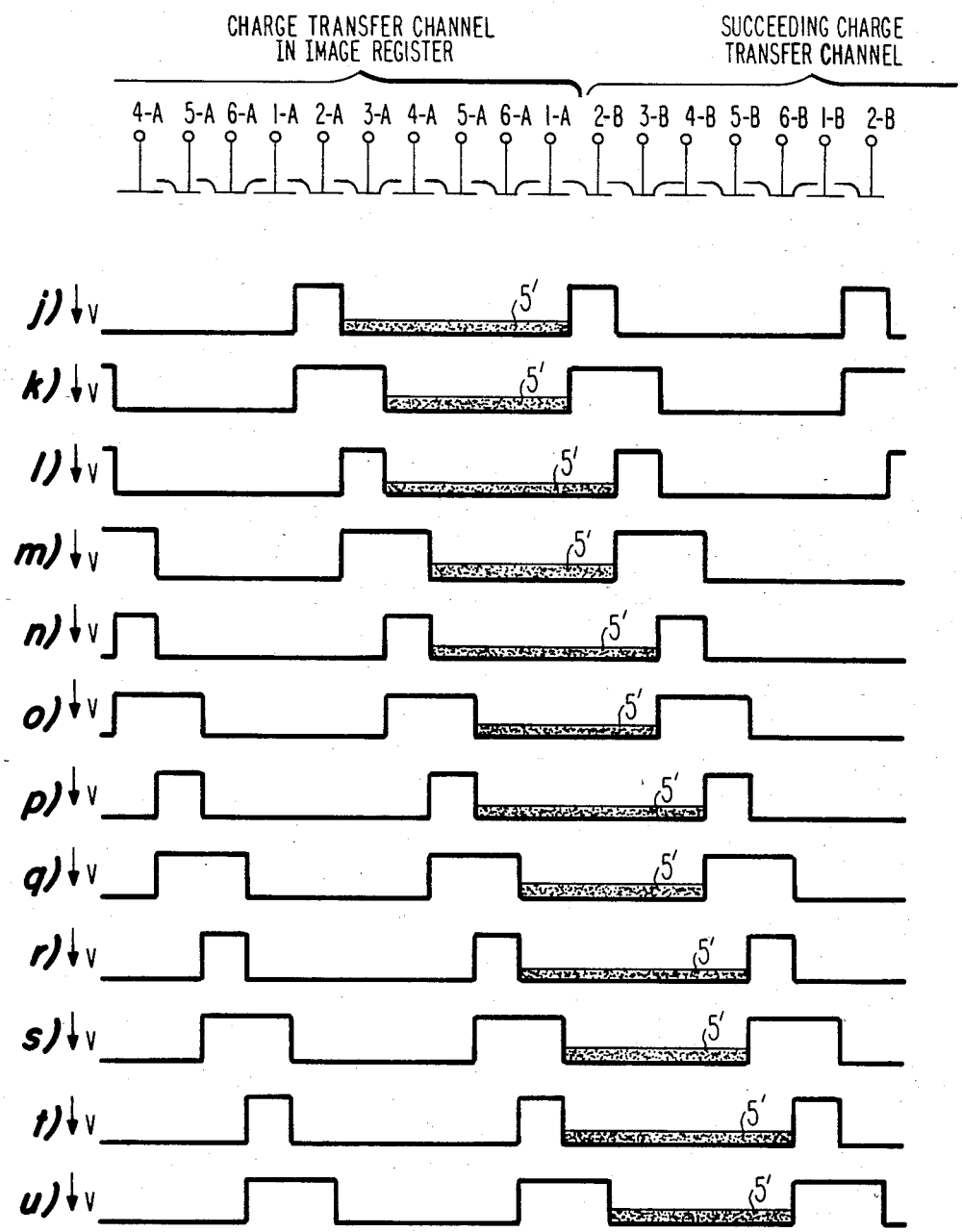

FIGS. 3A and 3B show by means of successive in-channel potential energy profiles (a)-(u) the initial portion of forward clocking a charge transfer channel in the image register of a CCD imager constructed in accordance with the invention, with the charge packet 5 descriptive of the first full-length pixel being transferred into a successive charge transfer channel. This charge packet 5 is shown as a stippled "liquid" contained in an advancing potential energy well.

At the head of each of FIGS. 3A and 3B the gate electrodes of the charge transfer channel in the image register are shown receiving six successively delayed phases $\phi_{1-A}$, $\phi_{2-A}$, $\phi_{3-A}$, $\phi_{4-A}$, $\phi_{5-A}$ and $\phi_{6-A}$ of clocking signal. As dimensioned on the leftmost $\phi_{5-A}$ gate electrode, gate electrodes in the image register have seven micron length to keep grain low. The six gate electrodes in each cycle of successive gate electrodes receptive of differently timed clock phases define a pixel length of six times seven, or forty-two microns. The gate electrodes of the succeeding charge transfer channel are also clocked with a six-phase clocking signal having the six successively delayed phases $\phi_{1-B}$, $\phi_{2-B}$, $\phi_{3-B}$, $\phi_{4-B}$, $\phi_{5-B}$ and $\phi_{6-B}$. Phases $\phi_{1-B}$, $\phi_{2-B}$, $\phi_{3-B}$, $\phi_{4-B}$, $\phi_{5-B}$ and $\phi_{6-B}$ of succeeding register clocking signal are synchronous with phases $\phi_{1-A}$, $\phi_{2-A}$, $\phi_{3-A}$, $\phi_{4-A}$, $\phi_{5-A}$ and $\phi_{6-A}$ respectively of image register clocking signal during the transfer of charge from a charge transfer channel in the image register to the succeeding charge transfer channel. The gate electrodes of clocking signal phases $\phi_{4-A}$, $\phi_{1-A}$, $\phi_{4-B}$, and $\phi_{1-B}$, are diagrammed as being formed in a first polysilicon layer. The gate electrodes receptive of clocking signal phases $\phi_{5-A}$, $\phi_{2-A}$, $\phi_{5-B}$, and $\phi_{2-B}$ are diagrammed as being formed in a second polysilicon layer. The gate electrodes receptive of clocking signal phases $\phi_{6-A}$, $\phi_{3-A}$, $\phi_{6-B}$ and $\phi_{3-B}$ are diagrammed as being formed in a third polysilicon layer.

Profile (a) shows an in-channel potential energy profile during an image integration time when the charge transfer channel in the image register receives a static clocking signal. In this static clocking signal $\phi_{4-A}$ phase gate electrodes receive a voltage that will induce a potential energy barrier in the portion of the charge transfer channel therebeneath energy barrier in the portion of the charge transfer channel therebeneath. The gate electrode of other phase receive a voltage that will induce potential wells in the charge transfer channel. The gate electrodes of the succeeding charge transfer channel receive dynamic clocking signal operating each over a range of voltages to vary the potential energy level under each of these gate electrodes over the range from barrier height to well floor.

Profile (b) shows an in-channel potential profile at the time that the application of dynamic clocking signal to the charge transfer channel in the image register is resumed in synchronism with the dynamic clocking signal applied to the succeeding charge transfer channel. This synchronous dynamic clocking of the charge transfer channels is done during the serial transfer of the charge packets from the charge transfer channel in the image register to the succeeding charge transfer channel.

Profile (c) shows the subsequent in-channel potential energy profile when clock signal phases $\phi_{4-A}$, $\phi_{5-A}$, $\phi_{4-B}$ and $\phi_{5-B}$ are made low to begin the process of advancing charge packets forward during charge packet transfer. The well length, which was thirty-five microns long in profiles (a) and (b) is shortened to twenty-eight microns. Any charge in excess of that which can be held in the shortened well flows into the anti-blooming drains which conventionally run alongside the charge transfer channels in the image register. The first full pixel charge packet subsequently is identified by the call-out 5' in profiles (c)–(u).

For given well depth and charge transfer channel width, then, charge handling capability is 28/42 or 2/3 what it could be if the number n of image register clocking signal phases approached infinite. This is twice the charge handling capability of a three-phase clocked image register of like charge transfer channel width using like well depth.

The remaining profiles (d)–(u) show the advance of potential energy well position in the six-phase forward clocking of the charge transfer process, which continues after profile (u) until all charge packets have been transferred out of the charge transfer channel in the image register and into positions in the succeeding charge transfer channel. Where line interlace on alternate fields is used in this six-phase clocked CCD imager, on fields alternate to that explicitly shown, the static clocking may place barrier-inducing voltage on the gate electrodes receptive of $\phi_{1-A}$ and well-inducing voltage on the gate electrodes receptive of $\phi_{2-A}$, $\phi_{3-A}$, $\phi_{4-A}$, $\phi_{5-A}$ and 100 $_{6-A}$ phases. When dynamic clocking of the charge transfer channel in the image register is resumed, the in-channel potential energy profile will be as shown in profile (h) and the subsequent potential energy profiles during charge transfer interval will be as in profiles (i)–(u), continuing on thereafter until all charge packets have been transferred out of the charge transfer channel in the image register.

A preferable way of providing interlace with the six-phase clocked imager is to integrate image in every field with barriers induced under both the $\phi_{1-A}$ and $\phi_{4-A}$ gate electrodes. This makes image integration the same in all fields and so avoids frame-rate flicker. At the close of one set of alternate fields the $\phi_{1-A}$ gate electrodes have barriers induced under them lowered; and at the close of the other set of alternate fields the $\phi_{4-A}$ gate electrodes have the barriers induced under them lowered. Operation of the imager during field transfer proceeds as previously described.

Using a large number of image register clock phases with pixels of long length in the direction of charge transfer, and of relatively narrow width, facilitates the construction of CCD imaging systems in which pixel length can be adjusted by selecting the number of clock phases in the image register (and any associated storage register). E.g., one might select among 12-, 6-, 4- and 3-phase clocking for the adjustment of the length of the pixels. Adjustment of the width of pixels can be made by using narrow charge transfer channels and combining the outputs of a selected number of the channels.

What is claimed is:

1. A method for operating a CCD imager with pixels of a dimension L at least thirty microns long in the direction of charge transfer without incurring unacceptable grain in video output signal samples therefrom, said method comprising the steps of:
  using gate electrodes in said image register having equal lengths, each shorter than the length at which grain is no longer kept satisfactorily low;
  during pixel transfer times, applying dynamic clocking signal to the gate electrodes crossing each CCD charge transfer channel in said image register in a number n of successive-in-time phases, n being greater than four and of such value as to equal L when multiplied by a positive integer times the length of gate electrodes in said image register;

during image integration times between said pixel transfer times in each CCD charge transfer channel, applying static clocking signal to the gate electrodes crossing each CCD charge transfer channel in said image register in said n phases, with no two phases of said static clocking signal applied to adjacent ones of the gate electrodes in said image register simultaneously having voltages such as to induce potential energy barriers in the charge transfer channels therebeneath, and with at least two phases of said static clocking signal having voltages such as to induce potential energy wells in charge transfer channels beneath the gate electrodes in said image register to which those phases of static clocking signal are applied;

arranging to illuminate said image register with a radiant energy image during said image integration times; and accumulating photoresponse to elements of said radiant energy image in said potential energy wells induced in the charge transfer channels.

2. A television camera comprising:

a solid-state imager, a CCD imager register included in said solid state imager having at least one charge transfer channel for accumulating therein during image integration times photoresponse to illumination by a radiant energy image, each said charge transfer channel being crossed by a succession of gate electrodes consecutively ordinally numbered first through $n^{th}$ in consecutive cycles of n successive gate electrodes, n being a positive integer at least five, each cycle of n successive gate electrodes having a dimension L of at least thirty microns in the direction of charge transfer, each of the n gate electrodes in each cycle being of similar length shorter than the length associated with the generation of excessive partitioning noise or grain, n thus exceeding L divided by that length associated with excessive partitioning noise or grain;

means for applying, during image integration time, to selected similarly ordinally numbered non-adjacent gate electrodes in said CCD image register, voltages which induce potential energy barriers in each charge transfer channel running thereunder;

means for applying, during each image integration time, to the remainder of the gate electrodes in said CCD image register, voltages which induce potential energy wells in each charge transfer channel running thereunder, in which potential energy wells charge packets are accumulated from photoreponse in said CCD image register; and means for applying, during transfer times interposed among said image integration times, dynamic clocking signal in first through $n^{th}$ consecutive-in-time phases, each of said phases being applied to the ones of said image register gate electrodes having the same ordinal number as that phase, which applying is for sufficient duration to transfer charge packets accumulated in said at least one charge transfer channel in said image register during the preceding image integration time to a succeeding portion of said solid state imager.

3. A television camera as set forth in claim 2 wherein said solid state imager is a field transfer type of CCD imager and wherein said succeeding portion of said solid state imager comprises a field storage register clocked n-phase during field transfer times, an output line register, and a charge sensing output stage.

4. A television camera as set forth in claim 2 wherein said solid state imager is a line transfer type of CCD imager and wherein said succeeding portion of said solid state imager comprises a charge sensing output stage and a CCD charge coupling network clocked n-phase during line transfer times connecting said CCD image register to said charge sensing output stage.

5. A method for operating a CCD imager with pixels of a dimension L at least thirty microns long in the direction of charge transfer without incurring unacceptable grain in video output signal samples therefrom, said method comprising the steps of:

arranging to use a succession of gate electrodes in said image register every $n^{th}$ one of which has a length shorter than that at which grain is no longer kept satisfactorily low, n being a positive integer greater than four, the length of each cycle of n successive gate electrodes in said image register dividing evenly into L an integral number of times;

during pixel transfer times, applying dynamic clocking signal to the gate electrodes crossing each CCD charge transfer channel in said image register in a number n of successive-in-time phases, thereby to transfer lines of charge packets from said image register to a succeeding portion of said CCD imager, one line after another;

during image integration times between said pixel transfer times in each CCD charge transfer channel, applying static clocking signal to the gate electrodes crossing each CCD charge transfer channel in said image register in said n phases, having voltages such as to induce potential energy barriers in the charge transfer channels under only said every $n^{th}$ ones of said gate electrodes beneath, and having voltages such as to induce potential energy wells in charge transfer channels beneath the remaining gate electrodes in said image register;

arranging to illuminate said image register with a radiant energy image during said image integration times; and accumulating photoresponse to elements of said radiant energy image in said potential energy wells induced in the charge transfer channels.

6. A method for operating a CCD imager, as set forth in claim 5, wherein said CCD imager is a field transfer type of CCD imager and wherein said succeeding portion of said CCD imager comprises a field storage register clocked n-phase during field transfer times, an output line register, and a charge sensing output stage.

7. A method for operating a CCD imager, as set forth in claim 5 wherein said CCD imager is a line transfer type of CCD imager and wherein said succeeding portion of said CCD imager comprises a charge sensing output stage and a CCD charge coupling network clocked n-phase during line transfer times connecting said CCD image register to said charge sensing output stage.

8. A television camera comprising:

a solid-state imager;

a CCD register included in said solid state imager having at least one charge transfer channel for accumulating therein during image integration times photoresponse to illumination by a radiant energy image, each said charge transfer channel being crossed by a succession of gate electrodes consecutively ordinally numbered first through $2m^{th}$ in consecutive cycles of 2m successive gate electrodes, 2m being a positive even integer at least six, each cycle of 2m successive gate electrodes having a dimension L of at least thirty microns in the direction of charge transfer, the $m^{th}$ and $2m^{th}$ gate electrodes in each cycle being of similar length shorter than the length associated with the generation of excessive partitioning noise or grain;

means for applying, during image integration times, to the $m^{th}$ and $2m^{th}$ gate electrodes in said CCD image register, voltages which induce potential energy barriers in each charge transfer channel running thereunder;

means for applying, during said image integration times, to the remainder of the gate electrodes in said CCD image register, voltages which induce potential energy wells in each charge transfer channel running thereunder, in which potential energy wells charge packets are accumulated from photoresponse in said CCD image register; and means for applying, during transfer times interposed among said image integration times, dynamic clocking signal to said image register gate electrodes for sufficient duration to transfer charge packets accumulated in said at least one charge transfer channel in said image register during the preceding image integration time to a succeeding portion of said solid state imager.

9. A television camera as set forth in claim 8 wherein said solid state imager is a field transfer type of CCD imager and wherein said succeeding portion of said solid state imager comprises a field storage register clocked synchronously with said image register during said transfer times, an output line register, and a charge sensing output stage.

10. A television camera as set forth in claim 9 wherein said transfer times interposed among said image integration times consist of first and second sets of alternate field transfer times; wherein said means for applying dynamic clocking signal to said image register gate electrodes applies that dynamic clocking signal during said first set of alternate field transfer times in first through $2m^{th}$ consecutive-in-time phases to the ones of said image register gate electrodes having the same ordinal number as that phase; and wherein said means for applying dynamic clocking to said image register gate electrodes applies that dynamic clocking signal during said second set of alternate field transfer times, the first through mth phases being applied to the $(m+1)^{th}$ through $2m^{th}$ register gate electrodes, respective and with the $(m+1)^{th}$ through $2m^{th}$ phases being applied to the first through $m^{th}$ image register gate electrodes, respectively, whereby field-to-field line interlace is achieved.

* * * * *